United States Patent
Tin

(10) Patent No.: US 10,319,687 B1
(45) Date of Patent: Jun. 11, 2019

(54) SOLUBLE SENSOR NODE AND METHOD OF MANUFACTURE

(71) Applicant: Honeywell International Inc., Morris Plains, NJ (US)

(72) Inventor: Steven Tin, Plymouth, MN (US)

(73) Assignee: Honeywell International Inc., Morris Plains, NJ (US)

(*) Notice: Subject to any disclaimer, the term of this patent is extended or adjusted under 35 U.S.C. 154(b) by 0 days.

(21) Appl. No.: 15/918,383

(22) Filed: Mar. 12, 2018

(51) Int. Cl.
| | |
|---|---|
| H01L 23/00 | (2006.01) |
| H01L 23/31 | (2006.01) |
| H01L 23/58 | (2006.01) |
| H01L 23/538 | (2006.01) |
| G01D 11/24 | (2006.01) |
| H01L 21/56 | (2006.01) |
| H01L 21/768 | (2006.01) |
| H01L 25/16 | (2006.01) |

(52) U.S. Cl.
CPC .......... *H01L 23/564* (2013.01); *G01D 11/245* (2013.01); *H01L 21/56* (2013.01); *H01L 21/76802* (2013.01); *H01L 21/76877* (2013.01); *H01L 21/76895* (2013.01); *H01L 23/3135* (2013.01); *H01L 23/3171* (2013.01); *H01L 23/5383* (2013.01); *H01L 23/5386* (2013.01); *H01L 23/58* (2013.01); *H01L 25/165* (2013.01); *H01L 25/167* (2013.01)

(58) Field of Classification Search
CPC .............. H01L 23/564; H01L 23/5385; H01L 23/5383; H01L 23/3135; H01L 23/5386; H01L 23/58; H01L 23/3171; H01L 25/165; H01L 25/167; H01L 21/76802; H01L 21/76895; H01L 21/56; H01L 21/76877; G01D 11/245
See application file for complete search history.

(56) References Cited

U.S. PATENT DOCUMENTS

| | | | |
|---|---|---|---|
| 4,828,966 A | * 5/1989 | Mallary | G11B 5/3163 257/E43.007 |
| 6,306,661 B1 | 10/2001 | Lakowicz et al. | |
| 6,815,186 B2 | 11/2004 | Clark, Jr. | |
| 7,935,540 B2 | 5/2011 | Kalgutkar et al. | |
| 8,002,966 B2 | 8/2011 | Chuang et al. | |
| 8,197,756 B2 | 6/2012 | Pison et al. | |
| 8,224,198 B2 | 7/2012 | Kubo | |
| 9,557,310 B2 | 1/2017 | Phillips et al. | |

(Continued)

FOREIGN PATENT DOCUMENTS

| | | |
|---|---|---|
| EP | 3123155 A1 | 2/2017 |
| WO | 9967627 A1 | 12/1999 |
| WO | 2015148232 A1 | 10/2015 |

OTHER PUBLICATIONS

Irimia-Vladu et al, "Green and Biodegradable Electronics", "Materials Today", Dated Jul.-Aug. 2012, pp. 340-346, vol. 15, No. 7-8, Publisher: Elsevier Ltd 2012.

(Continued)

*Primary Examiner* — Yosef Gebreyesus
(74) *Attorney, Agent, or Firm* — Fogg & Powers LLC

(57) ABSTRACT

A soluble sensor is provided. The soluble sensor includes a soluble handle substrate and a layer of semiconductor material that is disposed on the soluble handle substrate. The layer of semiconductor material includes a plurality of semiconductor devices interconnected to perform a sensing function.

15 Claims, 5 Drawing Sheets

(56) References Cited

U.S. PATENT DOCUMENTS

| | | | | |
|---|---|---|---|---|
| 2006/0065970 A1* | 3/2006 | Uchida | ............... | H01L 21/4882 |
| | | | | 257/700 |
| 2012/0228747 A1* | 9/2012 | Nozaki | ............... | H01L 21/0273 |
| | | | | 257/632 |
| 2012/0238094 A1* | 9/2012 | Minami | ................ | B24B 37/044 |
| | | | | 438/693 |
| 2014/0242323 A1* | 8/2014 | Giorgini | ................. | C08G 18/10 |
| | | | | 428/76 |
| 2017/0057812 A1* | 3/2017 | Zurutuza Elorza | ......................... | |
| | | | | B81C 1/00158 |

OTHER PUBLICATIONS

Irimia-Vladu, ""Green" Electronics: Biodegradable and Biocompatible Materials and Devices for Sustainable Future", "Chem Soc Rev", "www.rsc.org/chemsocrev", Dated Jan. 21, 2014, Retrieved Feb. 1, 2018, pp. Cover, 588-610, vol. 43, No. 2, Publisher: The Royal Society of Chemistry 2014.

Muthuraj et al, "Accepted Manuscript of: An Efficient Strategy to Assemble Water Soluble Histidine-Perylene Diimide and Graphene Oxide for the Detection of PPi in Physiological Conditions and in Vitro", "Biosensors and Bioelectric", "http://dx.doi.org/10.1016/j.bios.2015.12.036", Dec. 2015, pp. 1-25.

Sarker et al, "Designing a Battery-Less Piezoelectric Based Energy Harvesting Interface Circuit With 300 mV Startup Voltage", "Journal of Physics: Conference Series 431 (2013) 012025", "3rd ISESCO International Workshop and Conference on Nanotechnology 2012 (IWCN2012)", "IP Address 173.73.202.73", Retrieved on Jun. 3, 2018, pp. cover, 1-8, Publisher: IOP Publishing.

\* cited by examiner

SOLUBLE SENSOR NODE AND METHOD OF MANUFACTURE

BACKGROUND

With rapid growth of the Internet of Things (TOT) technology, more and more sensors are deployed to sense various environmental parameters or transmitted signals. Many of such sensors, especially for remote wireless sensing applications, have a very limited operational lifetime. To collect all of the sensors after a project is complete could be costly, time-consuming, or impossible. However, leaving the sensors in place when they are no longer needed, may pose both environmental and information security risks.

Therefore, there is a need in the art for a cost-effective approach to manage such sensors after their useful life is over.

SUMMARY

In one embodiment, a soluble sensor is provided. The soluble sensor includes a soluble handle substrate and a layer of semiconductor material that is disposed on the soluble handle substrate. The layer of semiconductor material includes a plurality of semiconductor devices interconnected to perform a sensing function.

BRIEF DESCRIPTION OF THE DRAWINGS

Embodiments of the present invention can be more easily understood and further advantages and uses thereof more readily apparent, when considered in view of the detailed description and the following figures in which.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention enable sensor nodes to be deployed for a limited time and purpose and, when no longer needed, to disappear into their surrounding with minimal environmental impact and little or no residue left behind. This is a highly desirable feature for both military and commercial applications that use sensors to gather data for a limited time. Advantageously, embodiments of the present invention use water-soluble materials as substrates and packaging together with ultra-thin electronics to create soluble sensor nodes. When the soluble sensor node is no longer needed, the soluble sensor node is dissolved by water. The soluble sensor node leaves very little residue in the environment compared to conventional sensor nodes.

Figure 1:
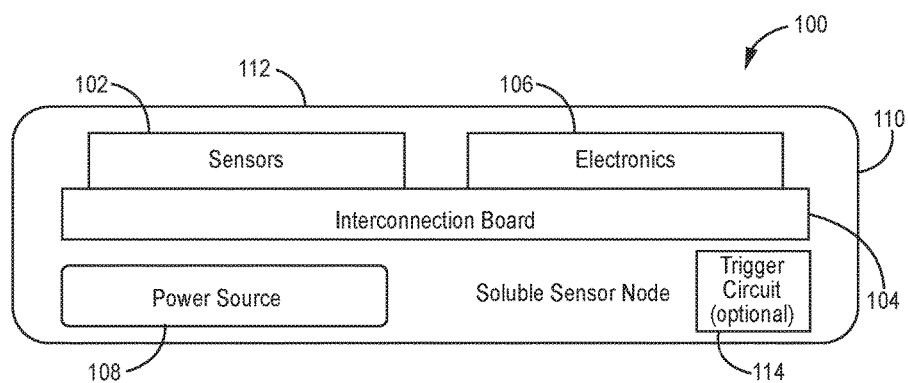
FIG. 1 is a block diagram of one embodiment of a soluble sensor node.

FIG. 1 is a block diagram of one embodiment of a soluble sensor node indicated generally at 100 that can be deployed as part of a network of sensor nodes to gather and transmit data. Each component of the soluble sensor node 100 is fabricated with a soluble element, such as, a substrate or layer of water-soluble material including but not limited to polyvinyl acetate (PVA), gelatin, polysaccharides, or the like. The soluble elements enable dissolution of soluble sensor node 100 by, for example, water in the form of rain, snow, sleet, mist, or the like, after soluble sensor node 100 is no longer needed. In other embodiments, the soluble elements dissolve using a chemical other than water. However, water-soluble materials are described here because water is environmentally friendly and does not require special application when the sensors are no longer needed since the sensors will naturally dissolve when precipitation falls on the sensors.

Soluble sensor node 100 includes a number of elements that are packaged together to make up the soluble sensor node. First, soluble sensor node 100 includes one or more sensors 102. By way of example and not by way of limitation, sensors 102 comprise one or more of magnetic, acoustic, radiation, vibration, chemical or other appropriate sensors. Additionally, soluble sensor node 100 includes an interconnection board 104 that interconnects sensors 102 with electronics 106. Electronics 106 perform functions including gathering data from sensors 102 and communicating the data from sensors 102 to another entity such as a server or main node of a network of soluble sensor nodes (See FIG. 9 and accompanying text). In some embodiments, electronics 106 implement a wireless communication protocol to communicate the data to the server or main node of the network. For sensors 102 and electronics 106, normal silicon-based devices are used to ensure high performance. The normal silicon-based devices are formed and interconnected in a layer of semiconductor material to enable the desired sensing function. As described in more detail below, the layer of semiconductor material is thinned and mounted on a layer, or substrate, of soluble material, such as a water-soluble material, to provide the advantage of easy dissolution of the soluble sensor node 100.

Further, soluble sensor node 100 also includes a power source 108. Power source 108 may comprise a thin solar cell, energy harvester, or other appropriate source of power for the sensors 102 and electronics 106.

Sensors 102, electronics 106, interconnection board 104 and power source 108 are encapsulated in a packaging material 110. In one embodiment, the packaging material comprises one or more of polyvinyl alcohol (PVA), gelatin, polysaccharides, or any other water soluble organic and inorganic materials). Packaging material 110 is coated on an exterior surface with a barrier coating 112. The barrier coating 112 protects the soluble elements of soluble sensor node 100 from exposure to, for example, water during the time that soluble sensor node 100 is in use. By way of example and not by way of limitation, the barrier coating 112 can be water insoluble organic and inorganic films such as polycarbonate, alumina, or the like, or surface eroding polymers such as polyanhydrides. In other embodiments, the barrier coating 112 can also be a UV-degradable polymer such as polyurethane.

Once the soluble sensor node 100 is no longer needed, the barrier coating 112 is breached or wears off. The barrier coating, in one embodiment, is breached by a trigger circuit 114 (optional). In one example, triggering circuit 114 includes patterned micro-heaters on the surface of soluble sensor node 100 inside the barrier coating 112. Once a trigger signal is received, current is applied to the heaters of the trigger circuit 114 to heat up the barrier coating 112 to either burn it or create stress cracks to expose soluble packaging 110 to the environments.

Alternatively, disposal of the soluble sensor node 100 is initiated based on a property of the material that makes up the barrier coating 112. For example, by engineering the thickness and properties of the barrier coating 112, the barrier coating 112 protects the water soluble elements of node 100 for a predetermined amount of time, or range of time, and then wears off. For such a time-triggered system, the expected water-dissolution rate or UV-degradation rate is used to determine the thickness of the barrier coating 112 needed for the required operation duration of the soluble sensor node 100. With the passage of sufficient time, the barrier coating 112 is worn off sufficiently so that the soluble sensor node dissolves.

Figure 2:
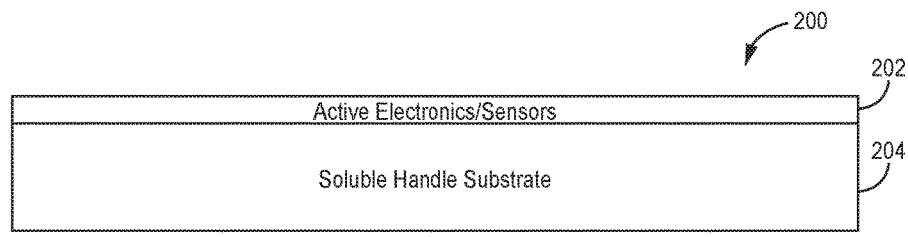
FIG. 2 is a side elevational view in cross-section of one embodiment of a soluble sensor.

FIG. 2 is a side elevational view in cross-section of one embodiment of a soluble sensor indicated generally at 200. Soluble sensor 200 may be used to implement sensors 102 of FIG. 1.

In this embodiment, soluble sensor 200 includes a layer of semiconductor material 202. Layer 202 houses the active electronics for the sensor. Soluble sensor 200 also includes soluble handle substrate 204.

In one embodiment, soluble sensor 200 is fabricated by forming the active electronics for the sensor in a layer of semiconductor material 202 using conventional semiconductor fabrication techniques. Once the devices are formed and interconnected to enable the sensor function, the semiconductor layer 202 is thinned down to less than 10 micrometers. A soluble material, such as water soluble material including but not limited to polyvinyl alcohol (PVA), gelatin, polysaccharides, or the like is deposited on the thinned layer of semiconductor material 202. This layer of soluble material 204 is spin coated or sprayed on to the layer of semiconductor material 202. Once deposited, the layer of soluble material 204 is cured to provide sufficient mechanical strength to protect the thin layer of semiconductor material 202. In one embodiment, the layer of soluble material 204 has a thickness from hundreds of microns on the side to centimeters on the side. Thus, the soluble handle substrate 204 is substantially thicker than the layer of semiconductor material 202. For example, the soluble handle substrate 204 could between 10 and 100 times as thick as the layer of semiconductor material 202. In other embodiments, the soluble handle substrate 204 could have a thickness up to 100 or 1,000 times or more than the thickness of the layer of semiconductor material 202.

Figure 3:
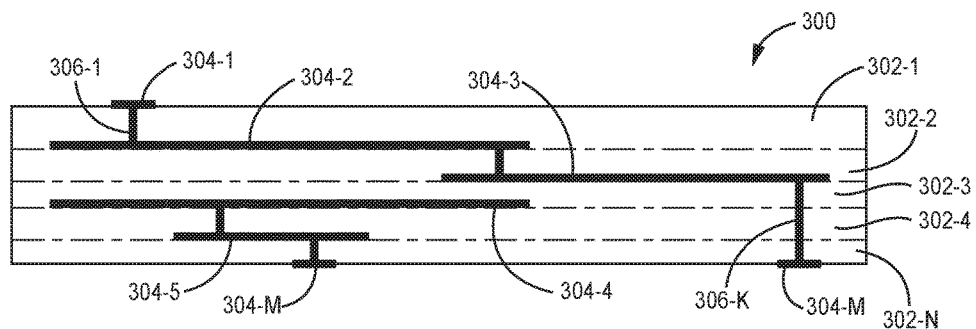
FIG. 3 is a side elevational view in cross-section of one embodiment of a soluble interconnection board.

FIG. 3 is a side elevational view in cross-section of one embodiment of a soluble interconnection board indicated generally at 300. Soluble interconnection board 300 is one embodiment of interconnection board 104 of FIG. 1.

In this embodiment, soluble interconnection board 300 includes layers of soluble material 302-1 to 302-N that are stacked and bonded together. Metal routing layers 304-1 to 304-M are disposed between and on the layers of soluble material 302 in the stack to provide for electrical connection for the soluble interconnection board 300. In one embodiment, one or more metal layers 304 are formed and patterned on a corresponding layer of water soluble material 302. The layers of water soluble material 302 are then stacked and bonded. For example, layer 302-N is formed by curing a layer of water soluble material. Metal layers 304-5 and 304-M are deposited via shadow mask on the surfaces of layer 302-N. Similarly, each of the other layers of soluble material 302 and metal layers 304 are also formed.

Soluble interconnection board 300 also includes vias 306-1 to 306-K to provide interconnection between metal layers 304. In one embodiment, vias 306-1 to 306-K are formed by drilling holes in the corresponding soluble layer(s) 302, for example, with a laser, and then filling the holes with metal. The individual soluble layers 302 with their associated metal layers 304 and vias 306 are stacked and bonded to form the soluble interconnection board 300. It is noted that the thickness (and hence the amount of material) of the soluble layers 302 is substantially more than the thickness (and amount of material) in the metal layers 304.

Figure 4:
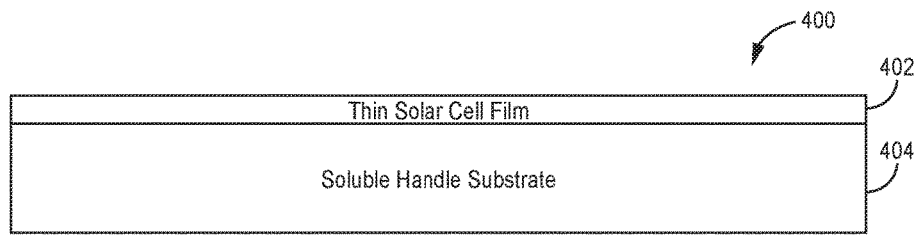
FIG. 4 is a side elevational view in cross-section of one embodiment of a soluble power source.

FIG. 4 is a side elevational view in cross-section of one embodiment of a soluble power source indicated generally at 400. Soluble power source 400 may be used to implement power source 108 of FIG. 1. In this embodiment, soluble power source 400 includes a layer with a thin film solar cell 402. A soluble material, such as water soluble material including but not limited to polyvinyl acetate (PVA), gelatin, polysaccharides, or the like is deposited on the thin film solar cell 402. This layer of soluble material is spin coated or sprayed onto the thin film solar cell 402 to form soluble handle substrate 404. Once deposited, the layer of soluble material is cured to provide sufficient mechanical strength to soluble handle substrate 404 to protect the thin film solar cell 402. As with soluble handle substrate 204, soluble handle substrate 404 is substantially thicker than thin film solar cell 402.

Figure 5:
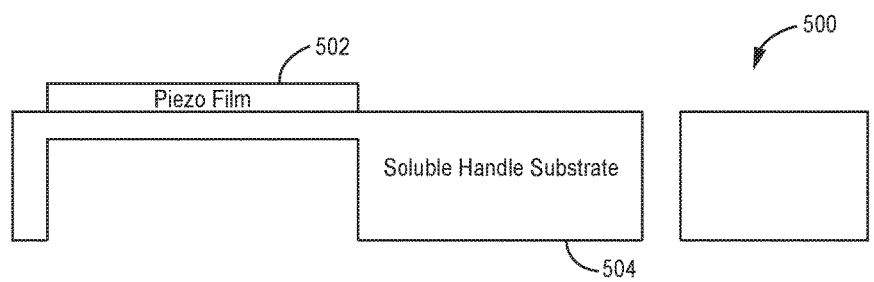
FIG. 5 is a side elevational view in cross-section of another embodiment of a soluble power source.

FIG. 5 is a side elevational view in cross-section of another embodiment of a soluble power source indicated generally at 500. Soluble power source 500 may be used to implement power source 108 of FIG. 1. In this embodiment, soluble power source 500 is an energy harvester. An energy harvester is a circuit that converts an ambient energy to electrical energy. Such harvesters typically use a piezoelectric element to harvest energy, such as vibrational energy, and convert that vibrational energy into electrical energy. In one embodiment, soluble power source 500 includes piezoelectric film 502 having a thickness of less than 10 micrometers and disposed on soluble handle substrate 504. In one embodiment, soluble handle substrate 504 comprises a cured layer of a water soluble material including but not limited to one or more of polyvinyl acetate (PVA), gelatin, polysaccharides, or the like. As with soluble handle substrate 204, soluble handle substrate 504 is substantially thicker than piezoelectric film 502.

Figure 6:
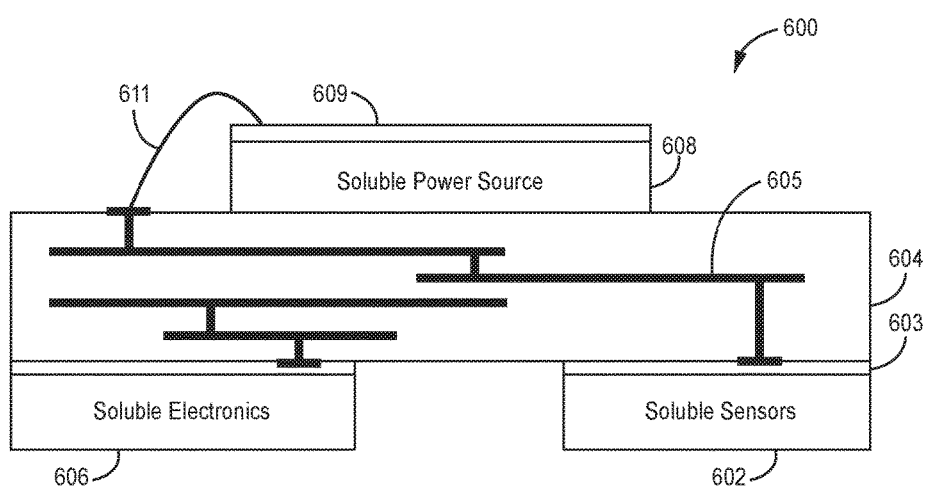
FIG. 6 is a side elevational view in cross-section of one embodiment of a soluble sensor node.

FIG. 6 is a side elevational view in cross-section of one embodiment of a soluble sensor node indicated generally at 600. The embodiment of FIG. 6 includes a number of components that are fabricated with soluble components to enable quick and effective dissolution of soluble sensor node 600 when its useful life has ended. Soluble sensor node 600 includes soluble sensors 602 interconnected with soluble electronics 606 through soluble interconnection board 604.

Soluble sensors 602 and soluble electronics 606 are powered by soluble power source 608.

Soluble sensor 602, soluble electrics 606 and soluble power source 608 are integrated together via, for example, a water soluble epoxy. Additionally, in some embodiments, wirebonding, such as wire bond 611, are used to make electrical connections such as between the soluble power source 608 and the soluble interconnection board 604. Additional wirebonds may be used as needed to provide electrical connections between soluble electronics 606 and soluble sensors 602 depending on the design and needs of a specific implementation of the soluble sensor node 600.

In one embodiment, soluble sensor node 600 is fabricated using soluble sensor 200 of FIG. 2 for soluble sensor 602, soluble interconnection board 300 of FIG. 3 for soluble interconnection board 604, and either soluble power source 400 or 500 of FIG. 4 or 5, respectively, for soluble power source 608.

Figure 7:
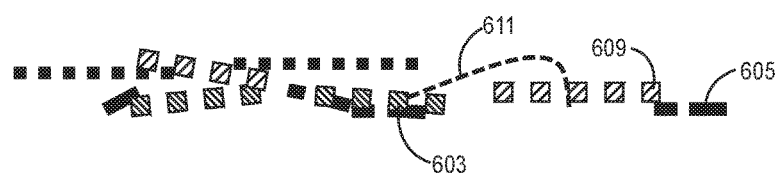
FIG. 7 illustrates the remains of the embodiment of the soluble sensor node of FIG. 6 after application of water to the sensor node.

FIG. 7 illustrates the remains of the embodiment of the soluble sensor node of FIG. 6 after application of water to the soluble sensor node 600. As shown, after water is applied to soluble sensor node 600, the soluble material is dissolved. The components that remain after dissolution of soluble sensor node 600 include the active electronics or semiconductor material in layer 603 of the soluble electronics 606 and the soluble sensors 602. Additionally, wirebond 611, and the component 609 that provides power in soluble power source 608, and the metal lines 605 in soluble interconnection board 604 also remain after dissolution of soluble sensor node 600. These components are a small fraction of the material that made up soluble sensor node 600. Thus, after dissolution due to, for example, rain, only a small amount of materials including bits of thin wires and thin semiconductor and metal layers will be left behind, which will be blown away and broken into dust in the environment. Further, dissolution of the soluble sensor node 600 will not have a negative impact on the environment through use of safe, environmentally friendly water-soluble materials.

Figure 8:
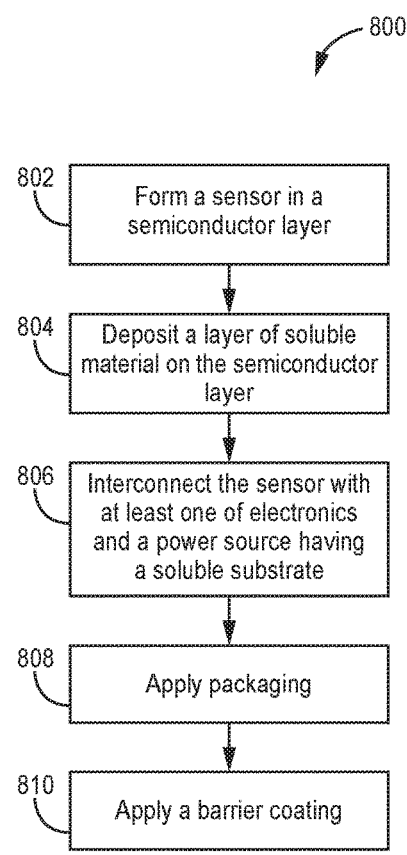
FIG. 8 is a flow chart that illustrates one embodiment of a method for manufacturing a soluble sensor node.

FIG. 8 is a flow chart that illustrates one embodiment of a method indicated generally at 800 for manufacturing a soluble sensor node. At block 802, sensor circuitry is formed in a layer of semiconductor material. This layer of semiconductor material is thinned down to less than 10 micrometers. At block 804, a layer of soluble material is deposited on the thinned semiconductor layer. In one embodiment, the soluble material is sprayed on. In other embodiments, the soluble material is spin coated on the layer of semiconductor material. The soluble material includes, by way of example and not by way of limitation, one of polyvinyl acetate, gelatin, or a polysaccharide. To provide mechanical stiffness, the layer of soluble material is cured. At block 806, the sensor is interconnected with at least one of soluble electronics and soluble power source through a soluble interconnection board. Each of the soluble electronics, the soluble power source, and the soluble interconnection board include a soluble substrate such as described above with respect to FIGS. 1-7. In addition, the soluble interconnection board also includes at least one metal layer formed on at least one surface of the soluble layer. The sensor, the soluble electronics, and the soluble power source are disposed on the soluble layer of the interconnection board and interconnected via the at least one metal layer. At block 808, the soluble sensor node is encased in soluble packaging. And, at block 810, the packaged sensor node has a barrier coating applied to an exterior surface of the packaging. As discussed above, this barrier coating protects the soluble components of the soluble sensor node from being exposed to, for example, water during the operational life of the soluble sensor node. Then, when the useful life of the soluble sensor node is past, the barrier coating is breached either by a trigger or due to the passage of sufficient time to wear away the barrier coating.

Figure 9:
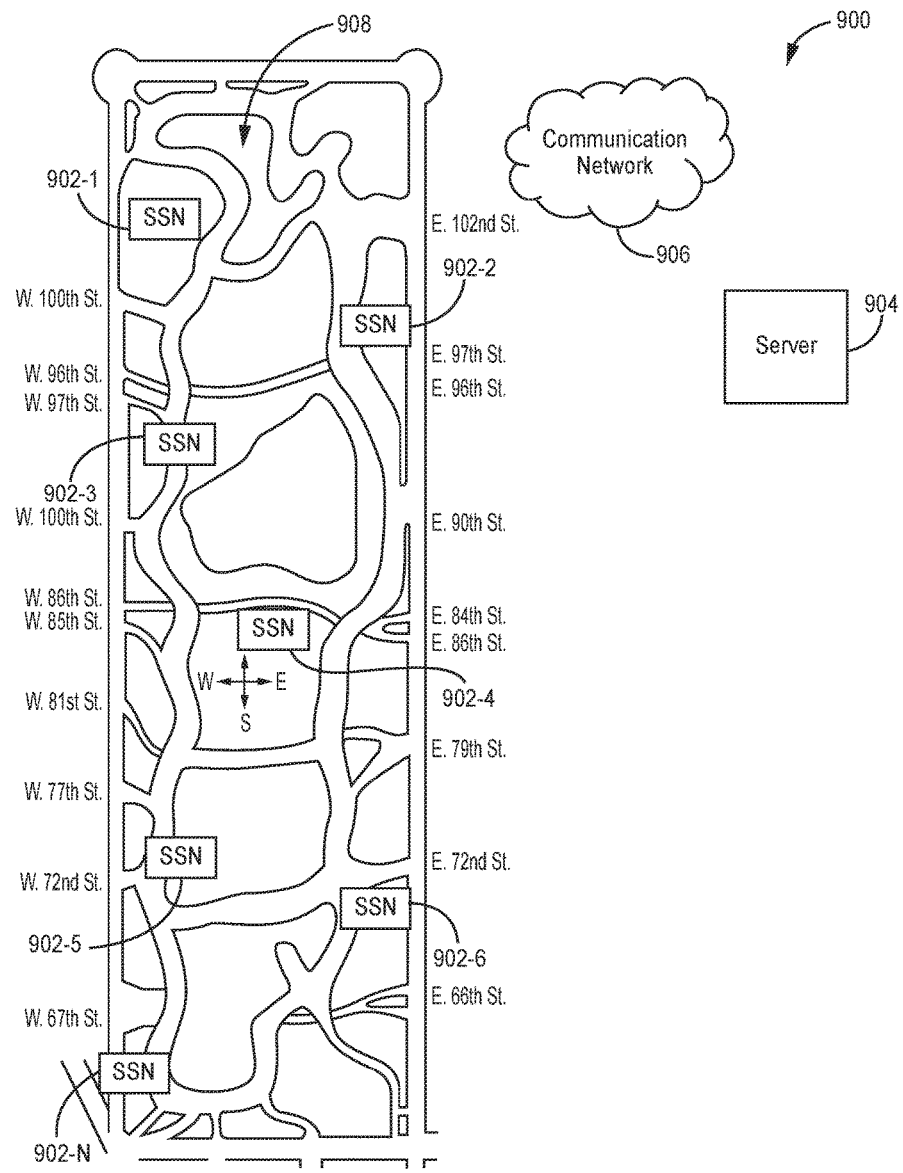
FIG. 9 is a block diagram of a system of sensor nodes each sensor node having a soluble sensor.

FIG. 9 is a block diagram of a system indicated generally at 900 of soluble sensor nodes (SSN) 902-1 to 902-N. Soluble sensor nodes 902-1 to 902-N are sensor nodes that are constructed and include soluble components such as described above with respect to FIGS. 1-8. In this embodiment, soluble sensor nodes 902-1 to 902-N communicate wirelessly with a server or central node 904. In one embodiment, central node 904 communicates with sensor nodes 902-1 to 902-N via a communication network 906 such as the Internet. In some embodiments, sensor nodes 902-1 to 902-N communicate wirelessly with communications network 906 using an appropriate communications protocol, e.g., Bluetooth, WiFi, LTE, or other cellular or wireless communication protocol. In other embodiments, one or more of soluble sensor node 902-1 to 902-N could communicate over a wired connection.

Advantageously, soluble sensor nodes 902-1 to 902-N can be placed in a region 908 on a temporary basis to gather and provide data for a selected period of time. When the soluble sensor nodes 902-1 to 902-N are no longer needed, a barrier coating on each soluble sensor node 902 is ruptured or wears off and the soluble components of the soluble sensor nodes 902-1 to 902-N are allowed to dissolve leaving just the non-soluble materials behind which are a fraction of the material making up the soluble sensor nodes 902-1 to 902-N.

Example Embodiments

Example 1 includes a soluble sensor, comprising a soluble handle substrate; and a layer of semiconductor material disposed on the soluble handle substrate, the layer of semiconductor material including a plurality of semiconductor devices interconnected to perform a sensing function.

Example 2 includes the soluble sensor of example 1, wherein the layer of semiconductor material comprises a layer of semiconductor material with a thickness of less than 10 micrometers.

Example 3 includes the soluble sensor of any of examples 1-2, wherein the soluble handle substrate comprises a substrate formed of one of polyvinyl acetate, gelatin, or a polysaccharide.

Example 4 includes the soluble sensor of any of examples 1-3, and further including a water barrier coating over an exterior surface of the sensor.

Example 5 includes the soluble sensor of example 4, wherein the water barrier coating has a thickness that is selected to wear off after a period of time within a selected range.

Example 6 includes the soluble sensor of examples 4, and further including circuitry that triggers breaking of the water barrier.

Example 7 includes a sensor node, comprising: one or more sensors; at least one interconnection board; a power source; and packaging to enclose the one or more sensors, the at least one interconnection board and the at least one power source; and wherein the one or more sensors, the at least one interconnection board, the power source and the packaging each include one or more soluble materials.

Example 8 includes the sensor node of example 7, wherein the interconnect board comprises metal lines formed on a soluble substrate.

Example 9 includes the sensor node of example 8, wherein the interconnect board comprises a multilayer board having a plurality of layers, wherein each layer includes a soluble material with at least one metal line formed on a surface of the soluble material, and wherein the layers of soluble material are bonded together in a stack.

Example 10 includes the sensor node of any of examples 7-9, wherein the power source includes a thin film solar cell formed on a soluble handle substrate.

Example 11 includes the sensor node of any of examples 7-10, wherein the power source includes an energy harvester having a piezoelectric film with a thickness of less than 10 micrometers formed on a soluble substrate.

Example 12 includes the sensor node of any of examples 7-11, wherein each of the one or more sensors comprises a layer of semiconductor material with a thickness of less than 10 micrometers, and a soluble handle substrate formed of one of polyvinyl acetate, gelatin, or a polysaccharide.

Example 13 includes the sensor node of any of examples 7-12, and further including a water barrier coating over an exterior surface of the packaging.

Example 14 includes the sensor node of example 13, wherein the water barrier coating has a thickness that is selected to wear off after a period of time within a selected range.

Example 15 includes the sensor node of example 13, and further including circuitry that triggers breaking of the water barrier.

Example 16 includes a method for fabricating a sensor node, the method comprising: forming a sensor in a layer of semiconductor material; thinning the layer of semiconductor material down to less than 10 micrometers; depositing a layer of soluble material to act as a substrate for the sensor; interconnecting the sensor with at least one of electronics and a power source, wherein the electronics and the power source also include a soluble substrate; applying packaging to encapsulate the interconnected sensor and the at least one of electronics and power source; and applying a barrier coating to an exterior surface of the sensor node.

Example 17 includes the method of example 16, wherein depositing a layer of soluble material comprises one of spin coating or spraying on a layer of one of polyvinyl acetate, gelatin, or a polysaccharide and curing the layer of water soluble material.

Example 18 includes the method of any of examples 16 and 17, wherein interconnecting the sensor with electronics and a power source comprises: forming a soluble layer; forming a metal layer on at least one surface of the soluble layer; disposing the sensor and the electronics on the soluble layer; and connecting the sensor and electronics via the metal layer.

Example 19 includes the method of example 18, wherein forming the soluble layer comprises forming a plurality of soluble layers and forming the metal layer comprises forming a metal layer on each of the plurality of soluble layers.

Example 20 includes the method of example 19, and further comprising forming vias in the soluble layers with a laser to form interconnects between the metal layers on the plurality of soluble layers.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A soluble sensor, comprising:
   a soluble handle substrate; and
   a layer of semiconductor material disposed on the soluble handle substrate, the layer of semiconductor material including a plurality of semiconductor devices interconnected to perform a sensing function.

2. The soluble sensor of claim 1, wherein the layer of semiconductor material comprises a layer of semiconductor material with a thickness of less than 10 micrometers.

3. The soluble sensor of claim 1, wherein the soluble handle substrate comprises a substrate formed of one of polyvinyl acetate, gelatin, or a polysaccharide.

4. The soluble sensor of claim 1, and further including a water barrier coating over an exterior surface of the sensor.

5. The soluble sensor of claim 4, wherein the water barrier coating has a thickness that is selected to wear off after a period of time within a selected range.

6. The soluble sensor of claim 4, and further including circuitry that triggers breaking of the water barrier.

7. A sensor node, comprising:
   one or more sensors;
   at least one interconnection board;
   a power source; and
   packaging to enclose the one or more sensors, the at least one interconnection board and the at least one power source; and
   wherein the one or more sensors, the at least one interconnection board, the power source and the packaging each include one or more soluble materials.

8. The sensor node of claim 7, wherein the interconnect board comprises metal lines formed on a soluble substrate.

9. The sensor node of claim 8, wherein the interconnect board comprises a multilayer board having a plurality of layers, wherein each layer includes a soluble material with at least one metal line formed on a surface of the soluble material, and wherein the layers of soluble material are bonded together in a stack.

10. The sensor node of claim 7, wherein the power source includes a thin film solar cell formed on a soluble handle substrate.

11. The sensor node of claim 7, wherein the power source includes an energy harvester having a piezoelectric film with a thickness of less than 10 micrometers formed on a soluble substrate.

12. The sensor node of claim 7, wherein each of the one or more sensors comprises a layer of semiconductor material with a thickness of less than 10 micrometers, and a soluble handle substrate formed of one of polyvinyl acetate, gelatin, or a polysaccharide.

13. The sensor node of claim 7, and further including a water barrier coating over an exterior surface of the packaging.

14. The sensor node of claim 13, wherein the water barrier coating has a thickness that is selected to wear off after a period of time within a selected range.

15. The sensor node of claim 13, and further including circuitry that triggers breaking of the water barrier.

* * * * *